United States Patent
Yu et al.

(10) Patent No.: US 6,624,090 B1
(45) Date of Patent: Sep. 23, 2003

(54) METHOD OF FORMING PLASMA NITRIDED GATE DIELECTRIC LAYERS

(75) Inventors: Mo Chiun Yu, Taipei (TW); Chien Hao Chen, Ilan (TW); Shih Chang Chen, Taoyuan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/140,661

(22) Filed: May 8, 2002

(51) Int. Cl.[7] .................. H01L 21/31; H01L 21/469
(52) U.S. Cl. .................. 438/769; 438/766; 438/775
(58) Field of Search .................. 438/765, 766, 438/769, 770, 775, 792, 795

(56) References Cited

U.S. PATENT DOCUMENTS

| | | | |
|---|---|---|---|
| 5,880,040 A | 3/1999 | Sun et al. | 438/769 |
| 6,110,842 A | 8/2000 | Okuno et al. | 438/776 |
| 6,197,701 B1 * | 3/2001 | Shue et al. | 438/763 |
| 6,251,761 B1 | 6/2001 | Rodder et al. | 438/591 |
| 6,258,730 B1 | 7/2001 | Sun et al. | 438/763 |

* cited by examiner

*Primary Examiner*—Alexander Ghyka
(74) *Attorney, Agent, or Firm*—George O. Saile; Stephen B. Ackerman

(57) ABSTRACT

A method of forming a thin silicon dioxide gate dielectric layer comprised with a nitrided silicon dioxide component, obtained via a plasma nitrogen procedure performed to a base silicon dioxide layer, has been developed. The silicon dioxide gate dielectric layer, comprised with a top portion of nitrided silicon dioxide, allows lower leakage currents to be realized when compared to non-nitrided silicon dioxide counterparts. To prevent nitrogen ions or radicals from penetrating the base silicon dioxide layer during the plasma nitrogen procedure, silicon oxynitride components are formed in the base silicon dioxide layer either during the growth procedures using $N_2O$, NO or $N_2O$/NO as reactants, or via a post growth anneal procedure, using an anneal ambient comprised of either $N_2O$, NO, or $N_2O$/NO.

19 Claims, 2 Drawing Sheets

METHOD OF FORMING PLASMA NITRIDED GATE DIELECTRIC LAYERS

BACKGROUND OF THE INVENTION

(1) Field of the Invention

The present invention relates to methods used to fabricate semiconductor devices, and more specifically to a method used to form a gate insulator layer.

(2) Description of Prior Art

The continuing trend to thinner gate insulator layers, to improve device performance as well as to reduce device operating voltages, presents potential yield and reliability concerns with the use of the ultra-thin insulator layers. Increased leakage current and greater risk of dielectric breakdown are two of the concerns encountered when employing ultra-thin insulator layers as the gate dielectric for metal oxide semiconductor field effect transistor (MOSFET) devices. The use of nitrided silicon dioxide layers for use as gate insulator layers can reduce the risk of leakage current and dielectric breakdown when compared to non-nitrided, silicon dioxide counterparts. However the process used to convert a silicon dioxide layer to a nitrided silicon dioxide layer, a nitrogen plasma procedure, can result in device degradation if the silicon dioxide layer is thin. Nitrogen penetration through the thin silicon dioxide layer to the semiconductor substrate can result in decreased channel mobility. Therefore an effective method to create nitrided silicon dioxide layers, nitrogen plasma procedures, can be a risky option when applied to silicon dioxide layers less than about 20 Angstroms.

This invention will describe a method of forming a thin, less than 20 Angstroms, nitrided silicon dioxide layer, via use of a nitrogen plasma procedure, without the risk of deleterious semiconductor phenomena occurring as a result of nitrogen penetration. This is accomplished via formation of a thin, base silicon dioxide layer comprised with incorporated components which retard penetration of nitrogen to the silicon dioxide-semiconductor interface during the nitrogen plasma procedure. Prior art such as Sun et al, in U.S. Pat. No. 6,258,730 B1, Shue et al, in U.S. Pat. No. 6,197,701 B1, Okumo et al, in U.S. Pat. No. 6,110,842, Rodder et al, in U.S. Pat. No. 6,251,761, and Sun et al, in U.S. Pat. No. 5,880,040, describe processes for forming thin silicon dioxide, as well as for forming and nitrided silicon dioxide gate insulator layers. None of these prior arts however describe the novel process sequence now presented featuring specific conditions for preparation of a thin silicon dioxide layer allowing a subsequent plasma nitrogen procedure to be used to form the desirable nitrided silicon dioxide layer, without substrate and device degradation.

SUMMARY OF THE INVENTION

It is an object of this invention to form a thin gate insulator layer comprised with a top nitrided silicon dioxide component, on a bottom silicon dioxide component.

It is another object to this invention to form the top nitrided silicon dioxide component of the thin gate insulator layer, via a nitrogen plasma procedure performed to a thin silicon dioxide layer.

It is still another object of this invention to incorporate silicon oxynitride in the thin gate insulator layer, prior to the nitrogen plasma procedure to retard nitrogen from reaching the surface of semiconductor substrate.

In accordance with the present invention a process of forming a nitrided silicon oxide component for a thin silicon dioxide gate insulator layer, via a plasma nitrogen procedure, featuring formation of silicon oxynitride components in the pre-plasma nitrogen, thin silicon dioxide gate insulator layer to retard nitrogen radicals from reaching the surface of the semiconductor substrate, is described. A thin silicon dioxide layer is prepared for subsequent nitridization with incorporated silicon oxynitride components. A first method of forming the silicon dioxide layer with incorporated silicon oxynitride components features a thermal oxidation procedure performed using either nitrous oxide ($N_2O$), nitric oxide (NO), or nitrous oxide/nitric oxide ($N_2O/NO$), as reactants. A second method of forming the silicon dioxide layer features thermal oxidation of the base silicon dioxide layer followed by an anneal procedure, performed in an ambient comprised of either $N_2O$, NO, or $N_2O/NO$, again resulting in a silicon dioxide layer with incorporated silicon oxynitride components. A plasma nitrogen procedure is then applied to the silicon dioxide layer resulting in a thin silicon dioxide layer featuring a top portion of nitrided silicon dioxide. The presence of the silicon oxynitride component in the silicon dioxide layer prevented nitrogen radicals from penetrating the thin silicon dioxide layer during the plasma nitrogen procedure, thus preventing substrate damage and degraded device parameters.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of forming a nitrided silicon dioxide gate insulator layer via conversion of a top portion of a base silicon dioxide layer to a nitrided silicon oxide component, will now be described in detail. Semiconductor substrate 1, comprised of P type, single crystalline silicon, with a <100> crystallographic orientation, is used and schematically shown in FIG. 1. The essence of this invention in addition to forming a nitrided silicon dioxide component as a top portion for a gate insulator layer, is to prepare a base silicon dioxide layer comprised with nitrogen retarding components, that will prevent nitrogen radicals from penetrating the thin, base silicon dioxide and reaching the surface of the semiconductor substrate during the plasma nitrogen procedure used to form the nitrided silicon dioxide component. Two embodiments describing methods of preparing such base silicon dioxide layers will be presented.

Figure 1:
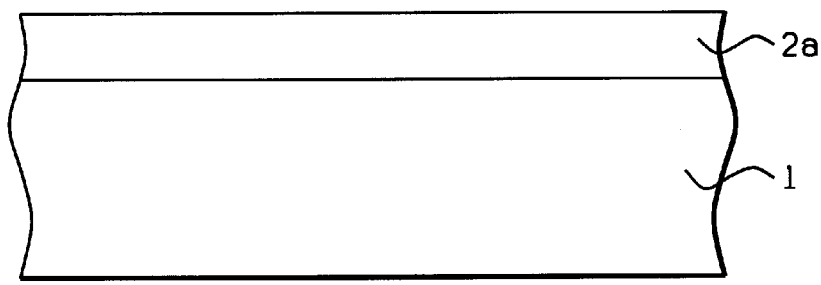
FIGS. 1, 2, 3, which schematically in cross-sectional style show a first embodiment of this invention in which a base silicon dioxide layer is thermally grown using either $N_2O$, NO, or $N_2O/NO$, as reactants for incorporation of silicon oxynitride components into the base silicon dioxide layer, to prevent nitrogen radicals from reaching the underlying semiconductor substrate during a subsequent plasma nitrogen, in turn used to convert the top portion of the base silicon dioxide layer to a nitrided silicon dioxide layer.

The first embodiment of this invention initiates with wet clean procedures, performed to semiconductor substrate 1, used to remove organic material as well as inorganic contaminants such as metallics, prior to an oxidation procedure. Base silicon dioxide layer 2a, schematically shown in FIG. 1, is thermally grown to a thickness between about 10 to 20 Angstroms. The thermal oxidation procedure is performed at a temperature between about 700 to 1000° C., in either a dry oxygen ambient, or in a oxygen-steam ambient.

Figure 2:
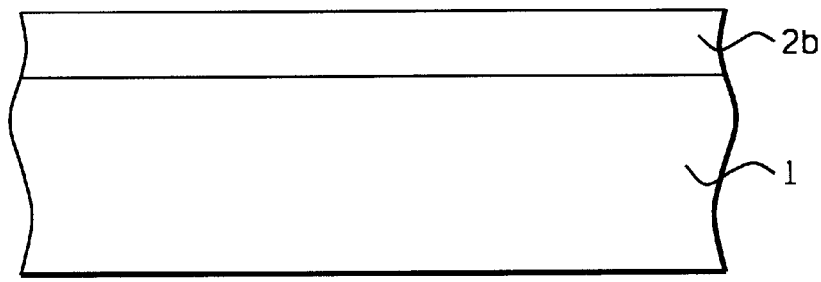

Base silicon dioxide layer 2a, is not comprised with specific components that will prevent nitrogen diffusion from reaching and degrading the surface of semiconductor substrate 1, during a subsequent plasma nitrogen procedure, therefore an anneal procedure is performed to provide the needed, nitrogen radical retarding component in the base silicon dioxide layer. The anneal procedure is performed in either a nitrous oxide ($N_2O$), nitric oxide (NO), or $N_2O$/NO, ambient 3, at a temperature between about 700 to 1200° C., for a time between about 0.1 to 5 min. The anneal procedure is either performed using conventional furnace procedures or using rapid thermal processing (RTP), procedures. The result of this anneal procedure is the formation of silicon dioxide layer 2b, now featuring incorporated silicon oxynitride components. This is schematically shown in FIG. 2.

Figure 3:
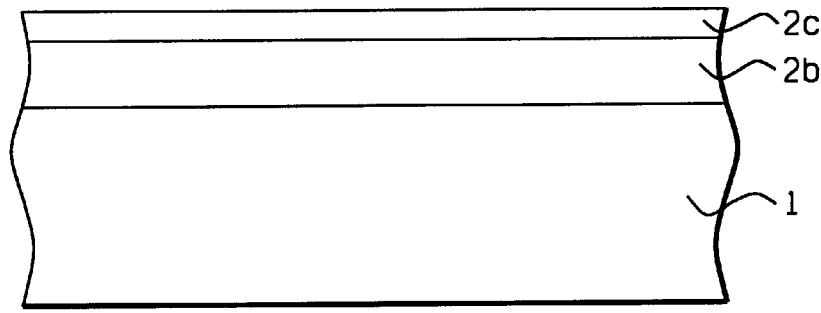

The formation of desired nitrided silicon dioxide layer 2c, in a top portion of silicon dioxide layer 2b, is next addressed and described schematically in FIG. 3. Silicon dioxide layer 2b, is subjected to a plasma nitrogen procedure, performed at an RF power between about 10 to 1000 watts, at a pressure between about 0.1 to 10 torr, at a temperature between about 25 to 1000° C., and for a time between 0.1 to 10 min, using a nitrogen or ammonia ($NH_3$) flow between about 1 to 100 sccm. Nitrogen ions 4, enter a top portion of silicon dioxide layer 2b, resulting in the formation of nitrided silicon dioxide layer 2c, at a thickness between about 5 to 15 Angstroms, overlying the remaining bottom portion of silicon dioxide layer 2b. The silicon oxynitride component, previously formed in base silicon dioxide layer 2a, prevented, or retarded nitrogen radicals from reaching the surface of semiconductor substrate 1, during the plasma nitrogen procedure, thus preventing degraded channel mobilities which can occur as a result of nitrogen reaching, and damaging the semiconductor surface. The composite silicon dioxide gate layer comprised with a top portion of nitrided silicon dioxide, results in lower leakage currents and improved control of short channel effects, when compared to counterparts fabricated without a nitrided silicon dioxide layer. In addition the presence of the nitrided silicon dioxide layer reduces the equivalent oxide thickness (EOT), of the gate insulator layer.

Figure 4:
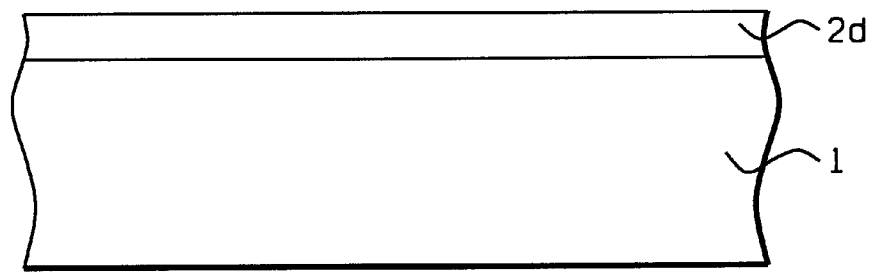
FIGS. 4, 5, 6, which schematically in cross-sectional style show a second embodiment of this invention in which a base silicon dioxide layer is thermally grown in a steam or oxygen only ambient, followed by an anneal procedure performed in either a $N_2O$, NO, or $N_2O/NO$ ambient, again to incorporate silicon oxynitride components into the base silicon dioxide layer prior to a plasma nitrogen procedure.

A second embodiment of this invention is next addressed featuring the growth of a base silicon dioxide layer with the silicon oxynitride component incorporated in the base silicon dioxide layer during the oxidation procedure. After performing the inorganic-organic wet clean procedure base silicon dioxide layer 2d, is thermally grown at a thickness between about 10 to 20 Angstroms, via RTP or via use of conventional furnace procedures. The oxidation procedure is performed at a temperature between about 700 to 1200° C., employing either $N_2O$, NO, or $N_2O$/NO as reactants. The nitrogen containing oxidation ambient supplies the needed silicon oxynitride component in base silicon dioxide layer 2d, thus eliminating the need for an anneal procedure in an nitrogen ambient to provide the silicon oxynitride component. This is schematically shown in FIG. 4.

Figure 5:
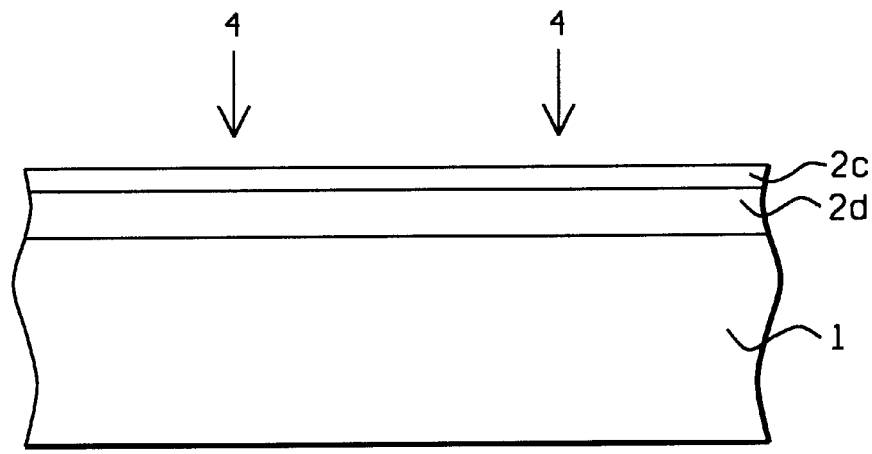

Formation of nitrided silicon dioxide layer 2c, in base silicon dioxide layer 2d, is again performed using conditions identical to conditions described in the first embodiment of this invention. The plasma nitrogen procedure is performed at an RF power between about 10 to 1000 watts, at a pressure between about 0.1 to 10 torr, at a temperature between about 25 to 1000° C., for a time between 0.1 to 10 min, using a nitrogen or $NH_3$ flow between about 1 to 100 sccm. Again nitrogen ions 4, enter a top portion of silicon dioxide layer 2d, resulting in the formation of nitrided silicon dioxide layer 2c, at a thickness between about 5 to 15 Angstroms, overlying the remaining bottom portion of base silicon dioxide layer 2d. This is schematically shown in FIG. 5. The silicon oxynitride component incorporated in base silicon dioxide layer 2d, during growth of base silicon dioxide layer 2d, again prevented, or retarded nitrogen radicals from reaching the surface of semiconductor substrate 1.

Figure 6:
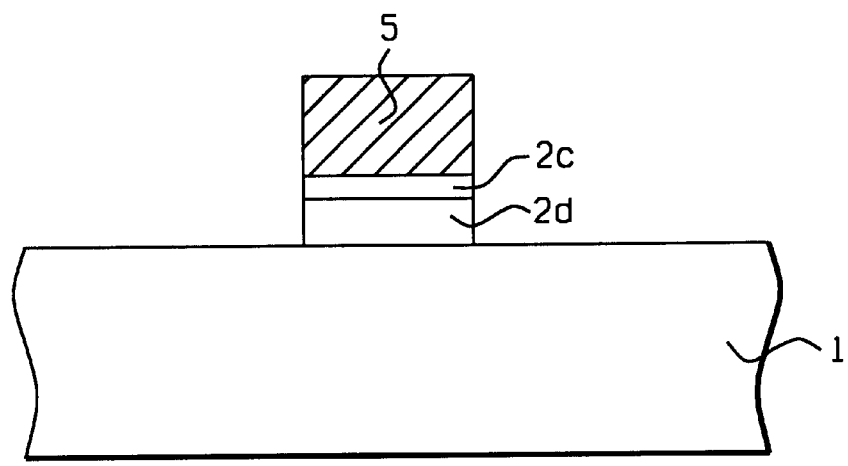

The formation of conductive gate structure 5, on a thin composite gate insulator layer, comprised of nitrided silicon dioxide layer 2c, on a bottom portion of base silicon dioxide layer 2d, is next addressed and schematically shown in FIG. 6. A conductive layer, such as doped polysilicon, a metal silicide layer, or a metal silicide-polysilicon layer, is deposited on the thin composite gate insulator layer via low pressure chemical vapor deposition (LPCVD), or via plasma vapor deposition (PVD), procedures, at a thickness between about 1000 to 3000 Angstroms. Conventional photolithographic and dry etching procedures, such as an anisotropic reactive ion etching procedure, is used to selectively define conductive gate structure 5, on the underlying thin composite gate insulator layer. The selective dry etch procedure, performed using $SF_6$ or $Cl_2$ as an etchant, terminated at the appearance of the top surface of nitrided silicon dioxide layer 2c.

While this invention has been particularly shown and described with reference to, the preferred embodiments thereof, it will be understood by those skilled in the art that various changes in form and details may be made without departing from the spirit and scope of this invention.

What is claimed is:

1. A method of forming a gate insulator layer on a semiconductor substrate, comprising the steps of:

forming a base insulator layer on said semiconductor substrate, said base insulator layer containing nitrogen based species used to protect said semiconductor substrate from reactants created in subsequent process steps; and performing a plasma procedure to convert a top portion of said base insulator layer to a plasma treated insulator layer, resulting in said gate insulator layer comprised of said plasma treated top portion of said base insulator layer, on an underlying bottom portion of said base insulator layer.

2. The method of claim 1, wherein said base insulator layer is a silicon dioxide layer, thermally grown to a thickness between about 10 to 20 Angstroms, at a temperature between about 700 to 1000° C., in an oxygen, or in an oxygen-steam ambient.

3. The method of claim 1, wherein said base insulator layer is subjected to an anneal procedure performed in either an $N_2O$, an NO, or an $N_2O$/NO ambient, at a temperature between about 700 to 1200° C., for a time between about 0.1 to 5 min, to form said incorporated species in said base insulator layer.

4. The method of claim 1, wherein said base insulator layer is a silicon dioxide layer comprised with said incorporated species, thermally grown to a thickness between about 10 to 20 Angstroms, at a temperature between about 700 to 1200° C., using either $N_2O$, NO, or an $N_2O$/NO as reactants.

5. The method of claim 1, wherein said incorporated species in said base silicon dioxide layer are comprised of silicon oxynitride.

6. The method of claim 1, wherein said plasma procedure is a plasma nitrogen procedure, performed in a nitrogen or NH$_3$ ambient, at a RF power between about 10 to 1000 watts, at a temperature between about 25 to 1000° C., for a time between about 0.1 to 10 min.

7. The method of claim 1, wherein said plasma treated top portion of said base silicon dioxide layer is a nitrided silicon dioxide layer, formed at a thickness between about 5 to 15 Angstroms.

8. A method of forming a gate insulator layer on a semiconductor substrate, wherein said gate insulator is comprised with a top portion of a nitrided silicon dioxide layer on a bottom portion of a base silicon dioxide layer, and wherein said base silicon dioxide layer is in turn comprised with an incorporated silicon oxynitride component, comprising the steps of:

growing a base silicon dioxide layer on said semiconductor substrate;

performing an anneal procedure in a nitrogen containing ambient, to incorporate said silicon oxynitride component in said base silicon dioxide layer; and performing a plasma nitrogen procedure to convert a top portion of said base silicon dioxide layer to said nitrided silicon dioxide layer, resulting in said gate insulator layer comprised of a top portion of said nitrided silicon dioxide layer, on an underlying bottom portion of said silicon dioxide layer.

9. The method of claim 8, wherein said base silicon dioxide layer is thermally grown to a thickness between about 10 to 20 Angstroms, at a temperature between about 700 to 1000° C., in an oxygen, or in an oxygen-steam ambient.

10. The method of claim 8, wherein said base silicon dioxide layer is subjected to an anneal procedure performed at a temperature between about 700 to 1200° C., for a time between about 0.1 to 5 min, to form said silicon oxynitride component in said base silicon dioxide layer.

11. The method of claim 8, wherein said nitrogen containing ambient used for said anneal procedure, is comprised of either N$_2$O, NO, or N$_2$O/NO.

12. The method of claim 8, wherein said plasma nitrogen procedure is performed in an ambient comprised of nitrogen or NH$_3$ ambient.

13. The method of claim 8, wherein said plasma nitrogen procedure is performed at a RF power between about 10 to 1000 watts, at a temperature between about 25 to 1000° C., for a time between about 0.1 to 10 min.

14. The method of claim 8, wherein said nitrided silicon dioxide layer is formed at a thickness between about 5 to 15 Angstroms.

15. A method of forming a gate insulator layer on a semiconductor substrate, wherein said gate insulator is comprised with a top portion of a nitrided silicon dioxide layer on a bottom portion of a base silicon dioxide layer, and wherein said base silicon dioxide layer is in turn comprised with an incorporated silicon oxynitride component, comprising the steps of:

growing a base silicon dioxide layer on said semiconductor substrate featuring incorporation of said silicon oxynitride; and performing a plasma nitrogen procedure to convert a top portion of said base silicon dioxide layer to said nitrided silicon dioxide layer, resulting in said gate insulator layer comprised of a top portion of said nitrided silicon dioxide layer on an underlying bottom portion of said silicon dioxide layer.

16. The method of claim 15, wherein said base silicon dioxide layer is thermally grown to a thickness between about 10 to 20 Angstroms, at a temperature between about 700 to 1200° C.

17. The method of claim 15, wherein said base dioxide layer is thermally grown in ambient comprised of either N$_2$O, an NO, or an N$_2$O/NO.

18. The method of claim 15, wherein said plasma nitrogen procedure is performed in a nitrogen or NH$_3$ ambient, at a RF power between about 10 to 1000 watts, at a temperature between about 25 to 1000° C., for a time between about 0.1 to 10 min.

19. The method of claim 15, wherein said nitrided silicon dioxide layer is formed at a thickness between about 5 to 15 Angstroms.

* * * * *